United States Patent
Stone

(10) Patent No.: US 8,673,681 B2
(45) Date of Patent: Mar. 18, 2014

(54) ELECTRICAL DEVICE FABRICATION

(75) Inventor: Kate Jessie Stone, Cambridge (GB)

(73) Assignee: Novalia Ltd., Cambridge (GB)

(*) Notice: Subject to any disclaimer, the term of this patent is extended or adjusted under 35 U.S.C. 154(b) by 515 days.

(21) Appl. No.: 12/296,772

(22) PCT Filed: Apr. 11, 2007

(86) PCT No.: PCT/GB2007/001337
§ 371 (c)(1),
(2), (4) Date: Oct. 10, 2008

(87) PCT Pub. No.: WO2007/128998
PCT Pub. Date: Nov. 15, 2007

(65) Prior Publication Data
US 2009/0275167 A1    Nov. 5, 2009

(30) Foreign Application Priority Data
Apr. 11, 2006   (GB) .................... 0607203.7

(51) Int. Cl.
*H01L 21/40*  (2006.01)
*H01L 21/22*  (2006.01)
*H01L 21/38*  (2006.01)
*H01L 21/20*  (2006.01)
*H01L 21/302* (2006.01)

(52) U.S. Cl.
USPC ............. 438/99; 438/736; 438/551; 438/584

(58) Field of Classification Search
USPC .................... 438/99, 736, 551, 584, 587, 553
See application file for complete search history.

(56) References Cited

U.S. PATENT DOCUMENTS

| 5,064,091 A | 11/1991 | Gerhard |
| 6,051,116 A * | 4/2000 | Ichinose et al. ............... 204/212 |
| 6,596,183 B2 | 7/2003 | Chen |
| 6,661,024 B1 * | 12/2003 | Zhang et al. .................... 257/40 |
| 6,866,799 B2 | 3/2005 | Orsbon et al. |
| 6,992,324 B2 | 1/2006 | Nagayama |
| 7,038,237 B2 | 5/2006 | Nagayama |
| 2002/0106458 A1 | 8/2002 | Montano et al. |

(Continued)

FOREIGN PATENT DOCUMENTS

| DE | 10 2004 031 719 A1 | 1/2006 |
| EP | 1 383 179 | 1/2004 |

(Continued)

OTHER PUBLICATIONS

International Search Report for PCT/GB07/01337 published on Nov. 15, 2007.

(Continued)

*Primary Examiner* — Chuong A. Luu
(74) *Attorney, Agent, or Firm* — Fleit Gibbons Gutman Bongini & Bianco PL; Martin Fleit; Paul D. Bianco

(57) ABSTRACT

The invention provides a method of making an electrical device, particularly a semiconductor device, having a substrate and etched electrodes formed on the substrate. The method employs flexography to print a resist pattern (7) onto a substrate (5) carrying a metal layer (8). Metal not protected by the resist can be etched away and then the resist (7) removed to leave exposed electrodes. Further materials (10, 11) can be disposed onto the exposed metal, such as organic semiconductors, to form transistors or diodes.

15 Claims, 1 Drawing Sheet

(56) References Cited

U.S. PATENT DOCUMENTS

| | | | |
|---|---|---|---|
| 2003/0035917 A1* | 2/2003 | Hyman | 428/67 |
| 2004/0012017 A1* | 1/2004 | Nagayama | 257/40 |
| 2004/0127065 A1 | 7/2004 | Cho et al. | |
| 2004/0149683 A1 | 8/2004 | Baek et al. | |
| 2004/0175550 A1 | 9/2004 | Lawrence et al. | |
| 2005/0064091 A1 | 3/2005 | Shunpei | |
| 2005/0089791 A1 | 4/2005 | Touwslager | |
| 2005/0186700 A1* | 8/2005 | Klauk et al. | 438/99 |
| 2006/0022194 A1 | 2/2006 | Nagayama | |
| 2006/0160266 A1* | 7/2006 | Bernds et al. | 438/99 |
| 2006/0238690 A1 | 10/2006 | Angelopoulos et al. | |
| 2007/0221610 A1* | 9/2007 | Chow et al. | 216/13 |
| 2009/0124090 A1 | 5/2009 | Stone | |

FOREIGN PATENT DOCUMENTS

| | | | |
|---|---|---|---|
| EP | 1 638 155 | | 9/2004 |
| JP | 2004 268319 | | 9/2004 |
| JP | 2004-268319 | * | 9/2004 |
| JP | 268319 | | 9/2004 |
| WO | 01/20691 A1 | | 3/2001 |
| WO | WO 03/067333 | | 8/2003 |
| WO | WO 2004/066348 | | 8/2004 |

OTHER PUBLICATIONS

Written Opinion for PCT/GB07/01337 published on Oct. 11, 2008.
International Preliminary Report on Patentability for PCT/GB07/01337 published on Oct. 14, 2008.
Machine Translation of JP 2004268319 translated in Jan. 28, 2011.
For U.S. Appl. No. 12/296,803: Notice of Allowance dated Aug. 8, 2012.
For U.S. Appl. No. 12/296,803: Office Actions dated Nov. 4, 2011; Apr. 2, 2012 Responses dated Feb. 6, 2012; Aug. 2, 2012 Notice of Allowance dated Aug. 8, 2012.
International Search Report published Nov. 13, 2012 for PCT/GB2007/001341.
Written Opinion published Oct. 11, 2008 for PCT/GB2007/001341.
International Prelim Report on Patentability published Oct. 14, 2008 for PCT/GB2007/001341.
For U.S. Appl. No. 12/296,803: Terminal Disclaimer dated Nov; 4, 2013, Notice of Allowance and Interview Summary dated Nov. 25, 2013.

* cited by examiner

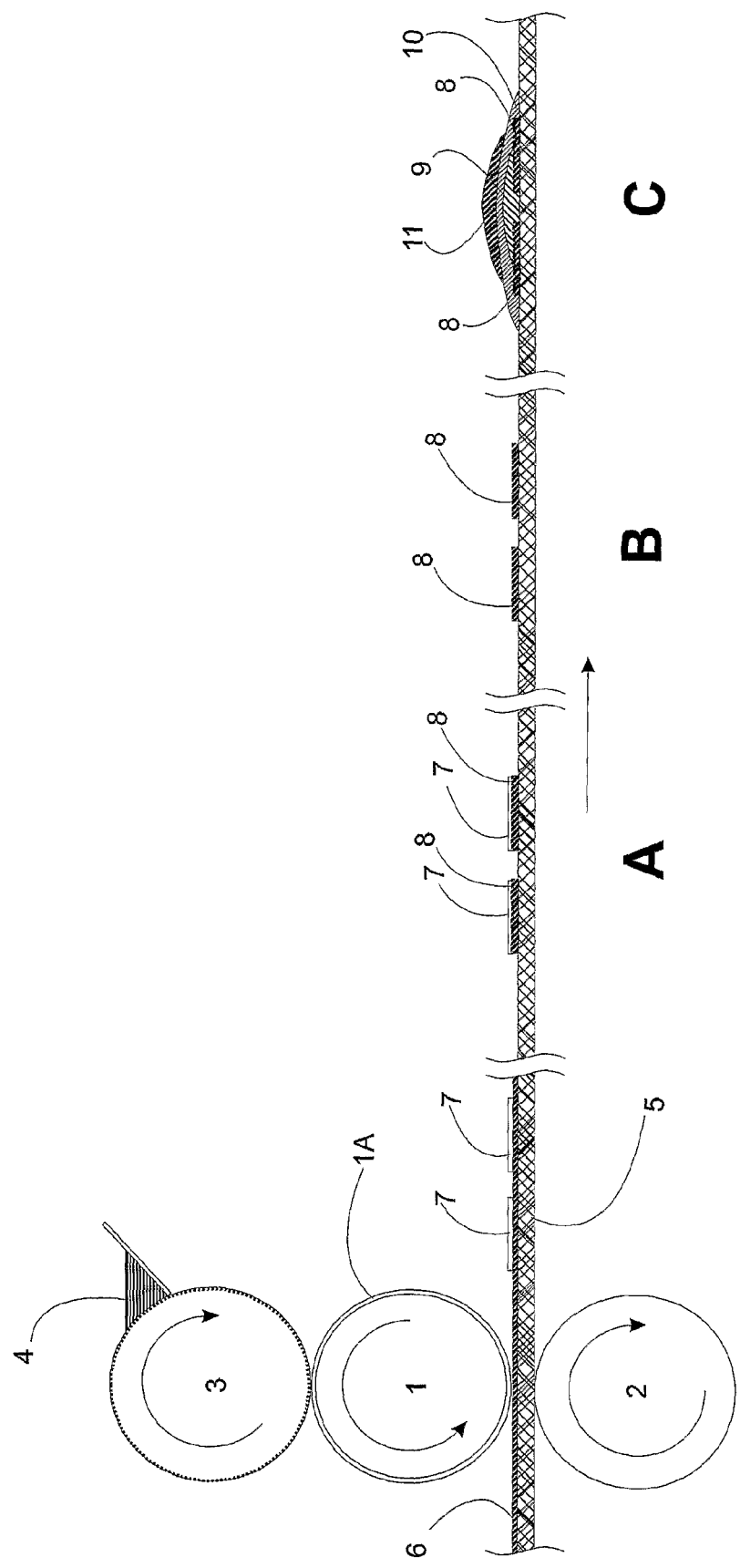

ELECTRICAL DEVICE FABRICATION

FIELD OF THE INVENTION

This invention relates to a method of making an electrical device having a substrate and etched electrodes formed on the substrate. The invention is particularly applicable to such methods wherein an electrical material, particularly an organic semiconductor, is deposited over the electrodes. However, the invention may also have application in other fields in which there is a requirement for closely-spaced conductors to be formed on a substrate.

BACKGROUND OF THE INVENTION

In the manufacture of organic semiconductor devices it is often desired to create electrodes that are spaced by a distance that is as small as possible to minimize resistance and therefore to maximize the speed of the device and its capacity to carry current. It is also preferable to make the electrodes as narrow as possible to reduce their capacitance, e.g. gate overlap capacitance. Conventionally, the electrodes are formed by one of three methods as follows:

Laser ablation. In this method, a metalized plastic substrate is patterned by using a laser to remove unwanted material.

Photolithography. In this method, photo resist is spun onto a substrate and then exposed to UV radiation through a patterned mask. The photoresist is then developed to allow unwanted parts of the resist to be removed, thereby uncovering an underlying metal layer. The uncovered parts of the metal are then removed by etching. In a variation of this method, there is no underlying metal layer; instead metal is evaporated onto the substrate in areas where it has been exposed by removal of the photo resist. Unwanted conductive material that is deposited over the photo resist is then removed by a solvent.

Conductive "Ink". In this method, a conductive material is printed directly onto a substrate using a process similar to that used in a conventional inkjet printer.

The electrically-conductive material can be metallic or can be a conductive organic material, for example, poly(3,4-ethylenedioxythiopene) PEDOT.

In another variation, a resist is printed by a jetting process onto a metalized substrate before etching. These methods all have shortcomings. Laser ablation gives good resolution, but is not conductive to large-area or high volume production, and requires specialized and expensive material. Photolithography gives good resolution but is slow, can not be used over a large area, and requires the step of removing the resist before application of the semiconductor. Printing with metallic inks results in an undesirably rough surface and is restricted to use with metals that can be formed into an ink and which, for that reason, do not have ideal electrical properties. For example, silver can be formed into suitable ink, but is a poor injector of charge. Electrically-conductive organic materials are available that are good as injectors of charge, but they are not good conductors of electricity.

This invention arose with the aim of overcoming some or all of the above-mentioned problems.

SUMMARY OF THE INVENTION

The invention provides a method of making an electrical device comprising forming a resist pattern onto a metal layer carried by a substrate and using a chemical etchant to remove the metal from areas not protected by the resist characterized in that the resist is applied onto the metal using flexography and that subsequent to etching the resist is removed to expose the remaining metal material.

After the etching process, the resist is preferably removed, thereby exposing the surface of the metal. Further material, such as a semiconductor material, may then be deposited to complete the electrical device, the metal parts exposed by the removal of the etch, forming its electrodes.

In flexographic printing, the resist is applied so as to adhere only to raised portions of a patterned area. Printing in that way can be fast and also economical because resist is not wasted. This is preferable to alternative methods in which the resist would be applied as a continuous layer and then selected parts removed to create the required resist pattern.

The resist has to be of a nature which permits it to be formed into an "ink", i.e. a liquid that can be printed onto the metal layer; to resist an etch used to remove the metal; and yet to be removable after the metal has been etched.

A solvent is preferably used to remove the resist after it has served its purpose. The resist needs to be selected to be soluble in this solvent, but insoluble in the etchant, and the metal needs to be selected to be insoluble in the solvent, but soluble in the etchant.

The aforementioned "further material" applied over the metal electrodes is preferably an organic semiconductor material so as to produce a transistor or diode. The scope of the invention additionally embraces the possibility of using other electrical materials so as to produce, for example an electro-voltaic cell or battery, a solar cell, or a display device. The scope of the invention also covers the possibility of leaving the metal conductors uncovered to define a conductive pattern for use as a radiation absorber, receiver, filter, or transmitter of electro-magnetic radiation.

It should be noted that it would be possible to leave the resist in place so as to form a functional component of the finished product. However, it is preferably removed so that the underlying metal surface is exposed and can contact a subsequently deposited layer. It is also to be noted that although flexographic printing is highly beneficial, other printing methods could be used. Thus, according to a second aspect of this invention, there is provided a method of making an electrical device comprising forming a resist pattern onto a metal layer carried by a substrate and using a chemical etchant to remove the metal from areas not protected by the resist characterized by the step of removing the resist after the etching process, thereby exposing the surface of the metal.

BRIEF DESCRIPTION OF THE DRAWING

One way of employing the invention will now be described by way of example with reference to the accompanying drawing, which is a schematic diagram showing the manufacture of semiconductor devices using a process in accordance with the invention.

DETAILED DESCRIPTION OF THE INVENTION

Referring to the drawing, there is shown a flexographic printing apparatus comprising a main roller 1, called an "impression cylinder", around which is wrapped a polymer sheet 1A defining, in relief, an image of a required pattern of electrodes in the finished product. This image is formed using methods that are well known in the field of flexographic printing. The main roller 1 cooperates with an idler roller 2 and an anilox roller 3, which is used to apply a measured amount of resist solution from a source 4 to the surface of raised portions of the polymer sheet 1A.

The resist solution is composed of a mixture of polymers dissolved in a non-aqueous solvent such as propyl alcohol or ethyl acetate acetone and composed so that the solution is of a suitable consistency for printing. One suitable commercially-available solution is Rohn and Haas Microposit™ S1813 Photo Resist.

A thin web 5 of inexpensive synthetic plastics carries a smooth-surfaced, vapor-deposited layer 6 of aluminum on its upper surface, this metal layer being about 30 to 40 nm thick. The surface of the metal may be treated, e.g. by corona discharge, to improve adhesion with the resist and to further reduce the aforementioned problems of pinhole occurrence. The metalized web is fed through a nip formed between the rollers 1 and 2 causing a pattern of the solution to be printed on the aluminum 6. When the solvent evaporates, the polymers form a printed pattern 7. At this point, it may be beneficial to heat the polymer to reduce the size and occurrence of pinholes and to smooth line edge roughness. The web is next immersed in an aqueous solution of Phosphoric/nitric acid/acetic acid blend, Microchem Systems Ltd (aluminum etch), which acts as an etchant to remove the aluminum from areas not protected by the resist, leaving selected areas of metal, as shown at A on the drawing. As an alternative to the etchant above, sodium hydroxide could be used.

The resist is then removed, using a suitable solvent such as Rohn and Haas FSC-H Microposit™ 1165 shown at B, to leave a pattern of electrodes 8, typically 50 microns wide and spaced by a distance of about 20 microns. Although only one pair of such electrodes is illustrated, it will be appreciated that the web will be formed with a very large number of such formations which may either be similar or different. They may be either electrically-separate or linked to form a complex circuit depending on the purpose of the product.

A solution of organic semiconductor is then printed so as to form a patch 9 about 100 nm thick on top of the smooth surface of each pair of electrodes as shown at C on the drawing. This printing operation is performed at a low temperature, below 100° C., which is harmless to the underlying web 5. This is followed by a layer 10, about 500 nm thick of a dielectric and finally a conductive gate 11 to form the finished transistor.

The described method is performed, in a continuous production process, using inexpensive aluminized synthetic plastics sheeting, e.g., of a type commonly used for packaging and bringing the economic benefit of using high volume existing printing processes. However, the invention is not limited to processes of this type and can also be employed, for example, in the manufacture of electro-voltaic cells, batteries, solar cells, and various display devices. The invention is also applicable in technical fields where there is a need to form closely-spaced conductors, but without an overlying electrical material, for example, in the construction of antenna and reflectors for electromagnetic radiation at terahertz wavelengths.

The invention claimed is:

1. A method of making a semiconductor device comprising:
    printing, using flexography, a resist pattern onto a metal layer carried by a substrate to define a pair of electrodes;
    forming the pair of electrodes by applying a chemical etchant to remove the unprinted portions of the metal layer from the substrate;
    removing the resist to expose the pair of formed electrodes; and
    forming an electrical or an electronic contact with the exposed pair of electrodes by adding a semiconductor material onto the pair of electrodes.

2. The method according to claim 1, wherein the removing the resist is carried out with a solvent, the resist soluble in the solvent and insoluble in the etchant, and the metal layer soluble in the etchant and insoluble in the solvent.

3. The method according to claim 1, wherein the adding a semiconductor material includes adding an organic semiconductor.

4. The method according to claim 1, wherein the semiconductor device made is a diode or a transistor.

5. The method according to claim 1, wherein the semiconductor device made is selected from the group consisting of a battery, an electro-voltaic cell, a solar cell, and a display device.

6. The method according to claim 1, wherein the pair of electrodes are spaced by a distance of approximately 20 microns.

7. A method of making a semiconductor device comprising:
    applying a resist pattern onto a printed portion of a metal carried by a substrate using flexography;
    forming a pair of electrodes by applying a chemical etchant to remove portions of the metal layer not protected by resist;
    removing the resist from the printed portion to expose the pair of electrodes, the removing carried out with a solvent, the resist soluble in the solvent and insoluble in the etchant, the metal layer soluble in the etchant and insoluble in the solvent; and
    forming an electrical or an electronic contact with the exposed pair of electrodes by adding a semiconductor material onto the pair of electrodes.

8. The method according to claim 7, wherein the adding a semiconductor material includes adding an organic semiconductor.

9. The method according to claim 7, wherein the semiconductor device made is a diode or a transistor.

10. The method according to claim 7, wherein the semiconductor device made is selected from the group consisting of a battery, an electro-voltaic cell, a solar cell, and a display device.

11. The method according to claim 7, wherein the pair of electrodes are spaced by a distance of approximately 20 microns.

12. A method of making a semiconductor device using a metalized substrate, comprising:
    printing a chemical resist material, using flexography, into a resist pattern onto the metal of the metalized substrate to define a plurality of electrodes to be formed within the metalized substrate coated by the resist material;
    forming the electrodes by applying a chemical etchant to remove the portions of the metalized substrate that are not coated by the resist material;
    removing the resist material to expose the formed electrodes protected by the resist; and
    forming an electrical or an electronic contact with exposed electrodes by adding a semiconductor material onto selected electrodes.

13. The method of claim 12, wherein removing the resist material is carried out with a solvent, the resist material soluble in the solvent and insoluble in the etchant, and the metal of the metalized substrate soluble in the etchant and insoluble in the solvent.

14. The method of claim 12, wherein the metalized substrate is fed through a nip formed between rollers.

15. The method of claim 12, wherein the metal of the metalized substrate is treated by corona discharge to improve adhesion with the resist material.

\* \* \* \* \*